United States Patent [19]
McGinn

[11] Patent Number: 4,745,370
[45] Date of Patent: May 17, 1988

[54] ADJUSTABLE PHASE SHIFT CIRCUIT

[75] Inventor: Michael McGinn, Scottsdale, Ariz.

[73] Assignee: Motorola, Inc., Schaumburg, Ill.

[21] Appl. No.: 81,085

[22] Filed: Aug. 30, 1987

[51] Int. Cl.$^4$ .............................................. H03F 3/45
[52] U.S. Cl. ................................... 330/252; 307/262; 330/302
[58] Field of Search ................. 330/94, 252, 302, 306; 307/262; 328/155; 329/164, 165; 331/25; 358/23, 35, 320

[56]  References Cited
U.S. PATENT DOCUMENTS
3,852,624 12/1974 Marik et al. ..................... 307/262 X Primary Examiner—James B. Mullins
Attorney, Agent, or Firm—Michael D. Bingham

[57] ABSTRACT

A circuit for shifting the phase of an applied differential input signal is disclosed which includes first and second differential amplifiers each having an input across which the input signal is applied, each differential amplifier having an input and an output transistor the emitters of which are coupled together via a respective capacitor. A first resistor is coupled between the emitter of the input transistor of first one of the differential amplifiers and the emitter of the output transistor of the second differential amplifier while a second resistor is coupled between the emitter of the input transistor of the second differential amplifier and the emitter of the output transistor of the first differential amplifier.

2 Claims, 1 Drawing Sheet

ADJUSTABLE PHASE SHIFT CIRCUIT

BACKGROUND OF THE INVENTION

The present invention relates to circuits for shifting the phase of an applied input signal a predetermined number of degrees and, more particularly, to an integrated ninety degree electronic phase shift circuit.

There are many applications for phase shift circuits of the above referred type. For instance, phase shift circuits are routinely used in phase locked loops (PLL) to maintain a quadrature relationship between the voltage controlled oscillator of the PLL and the input signal applied thereto. An additional use for a phase shift circuit is in the video detector portion of a high performance color television wherein the video signal is recreated. In this latter application it may be necessary to shift the phase of the intermediate frequency video carrier signal by ninety degrees with respect to an oscillator signal to maintain an in-phase relationship therebetween in order to detect the video information.

In order to obtain a high performance phase shift circuit it is important that it be wide band while eliminating small phase errors associated with transistor small signal emitter resistances or at least have adjustable circuitry for compensating for these resistances.

Hence, a need exists for a high performance circuit of the type described above which can be adjusted for eliminating transistor small signal resistance affects which otherwise create undesirable phase errors.

SUMMARY OF THE INVENTION

Accordingly, it is an object of the present invention to provide an improved circuit for shifting the phase of an input signal applied thereto.

It is another object of the present invention to provide an improved integrated phase shift circuit.

Still another object of the present invention is to provide an integrated circuit for shifting the phase of an applied input signal by ninety degrees.

Yet another object of the present invention is to provide an adjustable integrated phase shift circuit.

In accordance with the above and other objects there is provided a circuit comprising first and second differential amplifiers each including first and second transistors with the bases of the second transistors being coupled to a reference potential and the collectors thereof being coupled to utilization means; a first and second capacitors coupled between the emitters of the first and second transistors respectively of each differential amplifier; a first resistor coupled between the emitters of first transistor of the second differential amplifier and the second transistor of the first differential amplifier and a second resistor coupled between the emitters of the first transistor of the first differential amplifier and the second transistor of the second differential amplifier.

DETAILED DESCRIPTION OF THE PREFERRED EMBODIMENT

Figure 1:
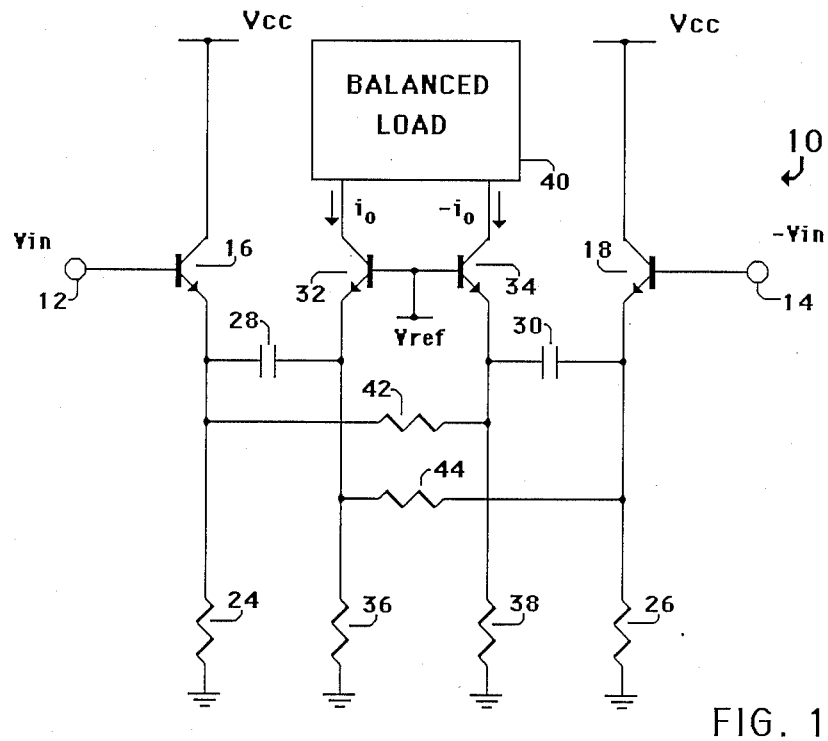
FIG. 1 is a schematic diagram illustrating the phase shift circuit of the preferred embodiment.
Figure 2:
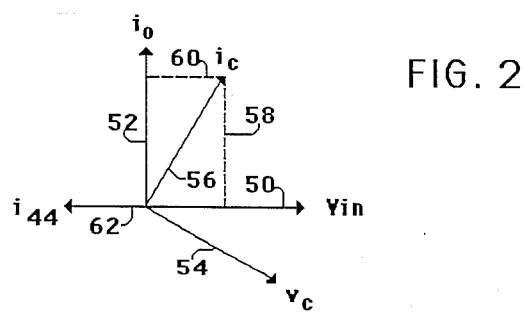
FIG. 2 is a vector diagram useful for understanding the circuit of FIG. 1.

Referring to FIGS. 1 and 2 the operation of phase shift circuit 10 of the present invention will now be explained. Phase shift circuit 10 is adapted to receive a differential input voltage Vin across inputs 12 and 14 to the base electrodes of transistors 16 and 18, the collectors of which are coupled to a first power supply conductor to which is supplied Vcc. The emitters of transistors 16 and 18 are coupled to a second power supply conductor via respective resistors 24 and 26 to which is supplied a ground reference potential. The emitter of transistor 16 is differentially coupled to the emitter of transistor 32 via capacitor 28 while the emitter of transistor 18 is coupled through capacitor 30 to the emitter of transistor 34. Transistor pairs 16, 32 and 18,34 essentially form a pair of differential amplifiers with the bases of transistors 32 and 34 being commonly connected to receive a bias potential Vref. The emitters of transistors 32 and 34 are also respectively coupled to the second power supply conductor via resistors 36 and 38. The collectors of transistors 32 and 34 are differentially coupled to a double balanced load or utilization means 40. Utilization means 40 may, for example, be a double balance demodulator circuit well known to those skilled in the art. Adjustable phase control is obtain by the pair of resistors 42 and 44 which are cross coupled between the emitters of transistors 16 and 34, and 18 and 32 respectively.

In operation the differential input voltage Vin is converted to a differential output current $i_o$ is produced at the collectors of transistors 32 and 34. Ideally, with matched transistors, the differential output current $i_o$ is phase shifted ninety degrees with respect to Vin. Hence, the voltage Vin applied, for instance, to the base of transistor 16 is level shifted and appears at the emitter thereof as illustrated by vector 50, FIG. 2. Vin is converted to the current $i_c$ through capacitor 28 to drive transistor 32 to, in turn, produce a the output current $i_o$ which are ninety degrees with respect to Vin, see vector 52. If the transistors were ideal resistors 42 and 44 would not be required. However, due to the small signal emitter resistances (re) associated with the bipolar transistors a small phase error is introduced which otherwise causes a phase shift to Vin, vector 54, as well as resultant current $i_c$, vector 56, source through capacitor 28 to transistor 32.

As illustrated, the current $i_c$ having phase error associated therewith is comprised of both a vertical component, vector 58, and a horizontal component, vector 60. As will be explained, cross-coupled resistors 42 and 44 are used to cancel the horizontal components of the phase error associated with $i_c$ and, thus, the differential output currents $i_o$ and $-i_o$. As understood, the differential input voltage applied at input 14 is out of phase with respect to Vin. This produces a current flow through resistor 44 which is out of phase with the horizontal component of $i_c$ flowing through capacitor 28. By adjusting resistor 44, the magnitude of $i_{44}$ can be adjusted until it, vector 62, cancels the horizontal component of $i_c$. Similarly, resistor 42 cancels the horizontal component of the capacitive current flowing through capacitor 30. Thus, the phase errors due to re are corrected by the cross-coupled resistors whereby the differential output currents $i_o$ and $-i_o$ appear in phase quadrature to Vin and $-$Vin.

Hence, what has been described above is a novel phase shift circuit suited to be manufactured in integrated circuit form in which small phase errors caused by the transistor small signal emitter resistances are corrected.

I claim:

1. A phase shift circuit, comprising:
   a first differential amplifier including first and second transistors, the base of said second transistor being biased at a reference potential;
   a second differential amplifier including third and fourth transistors, the base of said fourth transistor being biased at said reference potential;
   means for coupling the bases of said first and third transistors to a pair of inputs of the phase shift circuit to which a differential input voltage is supplied;
   first capacitive means coupled between the emitters of said first and second transistors;
   second capacitive means coupled between the emitters of said third and fourth transistors;
   first resistive means coupled between said emitters of said second and third transistors;
   second resistive means coupled between said emitters of said first and fourth transistors; and
   means for coupling the collectors of said second and fourth transistors to utilization means.

2. An integrated circuit responsive to an applied differential input voltage signal for producing differential output currents that are in phase quadrature to the applied input voltage signal, comprising:
   a first differential amplifier including first and second transistors, the base of said second transistor being biased at a reference potential;
   a second differential amplifier including third and fourth transistors, the base of said fourth transistor being biased at said reference potential;
   means for coupling the bases of said first and third transistors to a pair of inputs of the circuit to which the differential input voltage signal is supplied;
   first capacitive means coupled between the emitters of said first and second transistors;
   second capacitive means coupled between the emitters of said third and fourth transistors;
   first resistive means coupled between said emitters of said second and third transistors;
   second resistive means coupled between said emitters of said first and fourth transistors; and
   means for coupling the collectors of said second and fourth transistors to respective outputs of the circuit.

* * * * *